United States Patent
Ng et al.

(10) Patent No.: US 8,610,507 B2
(45) Date of Patent: Dec. 17, 2013

(54) POWER AMPLIFIER

(75) Inventors: Choon Yong Ng, Kawasaki (JP); Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 13/331,513

(22) Filed: Dec. 20, 2011

(65) Prior Publication Data

US 2012/0268211 A1  Oct. 25, 2012

(30) Foreign Application Priority Data

Apr. 19, 2011 (JP) ................................. 2011-093210

(51) Int. Cl.
*H03F 3/14* (2006.01)
(52) U.S. Cl.
USPC ........................................................ 330/307
(58) Field of Classification Search
USPC ................... 330/277, 302, 306, 307; 333/247
See application file for complete search history.

(56) References Cited

U.S. PATENT DOCUMENTS

| 5,233,313 A | * | 8/1993 | Kohno et al. | 330/307 |
| 6,201,454 B1 | | 3/2001 | Kinayman et al. | |
| 6,734,728 B1 | * | 5/2004 | Leighton et al. | 330/307 |
| 6,759,742 B2 | | 7/2004 | Budka | |
| 7,911,271 B1 | * | 3/2011 | Jia | 330/307 |

FOREIGN PATENT DOCUMENTS

| JP | 6-5794 A | 1/1994 |
| WO | WO 2008/053748 A1 | 5/2008 |

OTHER PUBLICATIONS

Japanese Office Action issued May 7, 2013 in Patent Application No. 2011-093210 with English Translation.

* cited by examiner

*Primary Examiner* — Khanh V Nguyen
(74) *Attorney, Agent, or Firm* — Oblon, Spivak, McClelland, Maier & Neustadt, L.L.P.

(57) ABSTRACT

According to an embodiment, a power amplifier includes: an MMIC substrate; a high frequency probe pad disposed on the MMIC substrate; and a metal plate disposed on the MMIC substrate so as to adjoin to the high frequency probe pad, and connected to an MMIC external circuit via a bonding wire.

8 Claims, 13 Drawing Sheets

POWER AMPLIFIER

CROSS REFERENCE TO RELATED APPLICATIONS

This application is based upon and claims the benefit of priority from prior Japanese Patent Application No. P2011-093210 filed on Apr. 19, 2011, the entire contents of which are incorporated herein by reference.

FIELD

Embodiment described herein generally relates to a power amplifier.

BACKGROUND

There is a Monolithic Microwave Integrated Circuit (MMIC) as a technology for forming a plurality of amplifying units composed of a transistor, a matching circuit and a bias circuit on one semiconductor substrate by connecting in series the plurality of the amplifying units, in order to obtain high gain.

Such the MMIC uses wire bonding for connecting MMIC external circuits, such as a package and electric wiring of substrate.

When the MMIC having a high frequency probe pad is connected to the MMIC external circuit, the length of the bonding wire is increased and therefore the value of an inductance component of the bonding wire is also increased in proportion as a connecting distance between the MMIC and the MMIC external circuit is increased. In order to reduce such an effect, a method of increasing the number of the bonding wires has been used. However, since the size of obtainable area is limited in the high frequency probe pad, the number of the bonding wires which can be increased is also limited.

DETAILED DESCRIPTION

Hereinafter, embodiments will be described with reference to drawings.

Certain embodiments provide a power amplifier including an MMIC substrate, a high frequency probe pad, and a metal plate. The high frequency probe pad is disposed on the MMIC substrate. The metal plate is disposed on the MMIC substrate so as to adjoin to the high frequency probe pad.

First Embodiment

Figure 1:
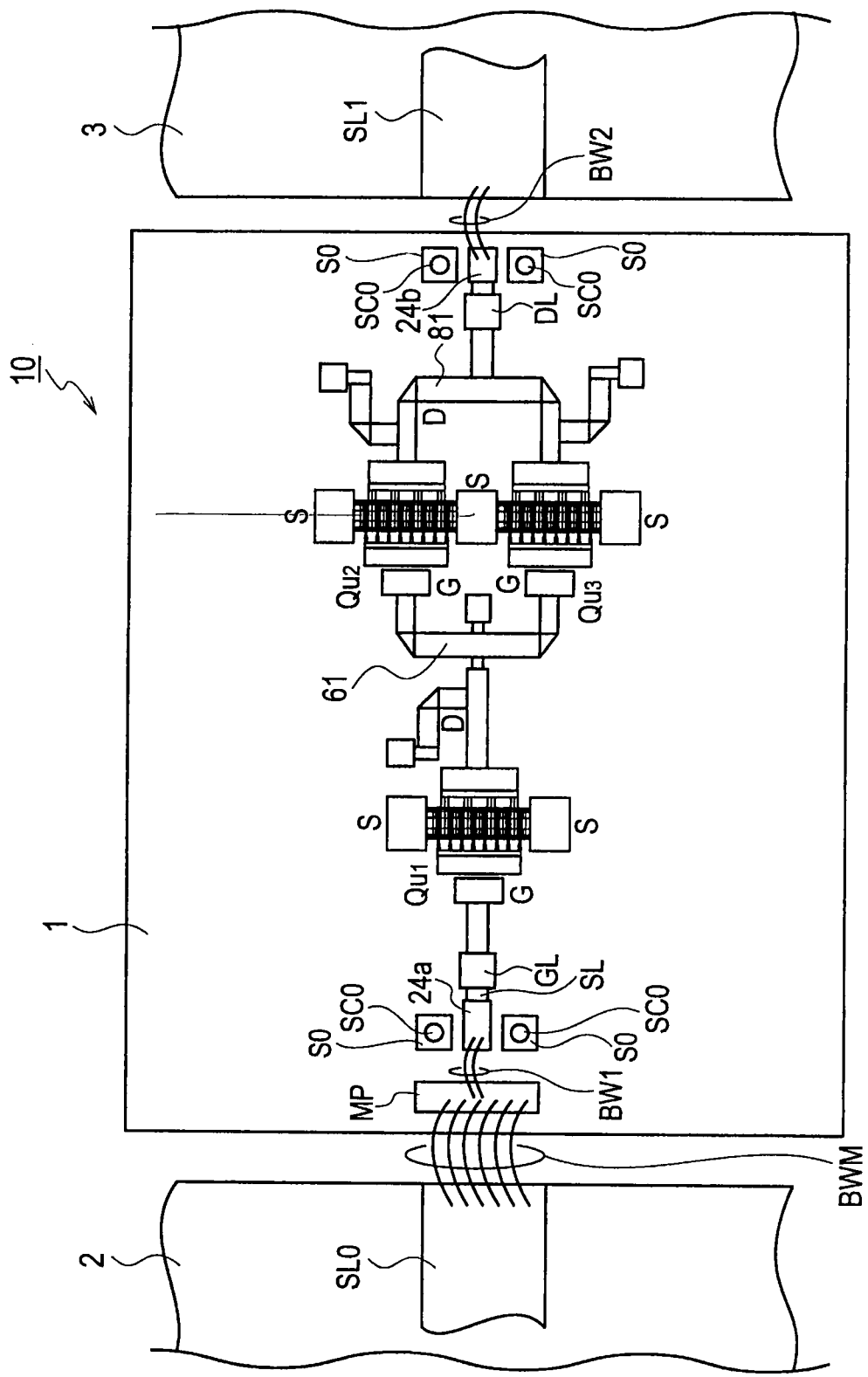
FIG. 1 is a schematic planar pattern configuration diagram showing a power amplifier according to an embodiment.
Figure 2:
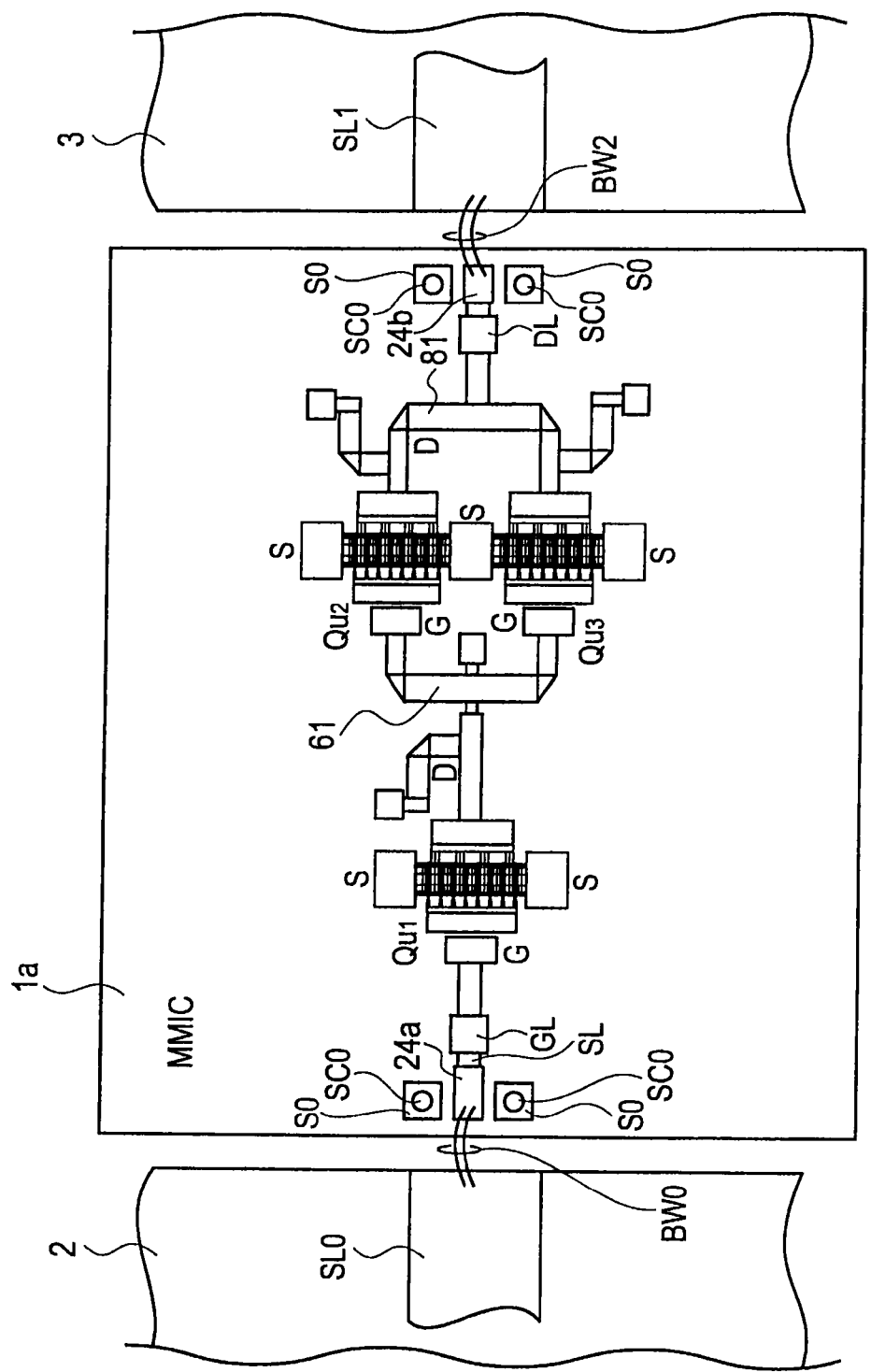
FIG. 2 is a schematic planar pattern configuration diagram showing a power amplifier according to a comparative example.

A schematic planar pattern configuration showing a power amplifier 10 according to an embodiment is represented as shown in FIG. 1, and a schematic planar pattern configuration showing a power amplifier 10a according to a comparative example is represented as shown in FIG. 2. The power amplifier 10 according to the embodiment is formed on an MMIC substrate 1. Similarly, the power amplifier 10a according to the comparative example is formed on an MMIC substrate 1a.

Figure 14:
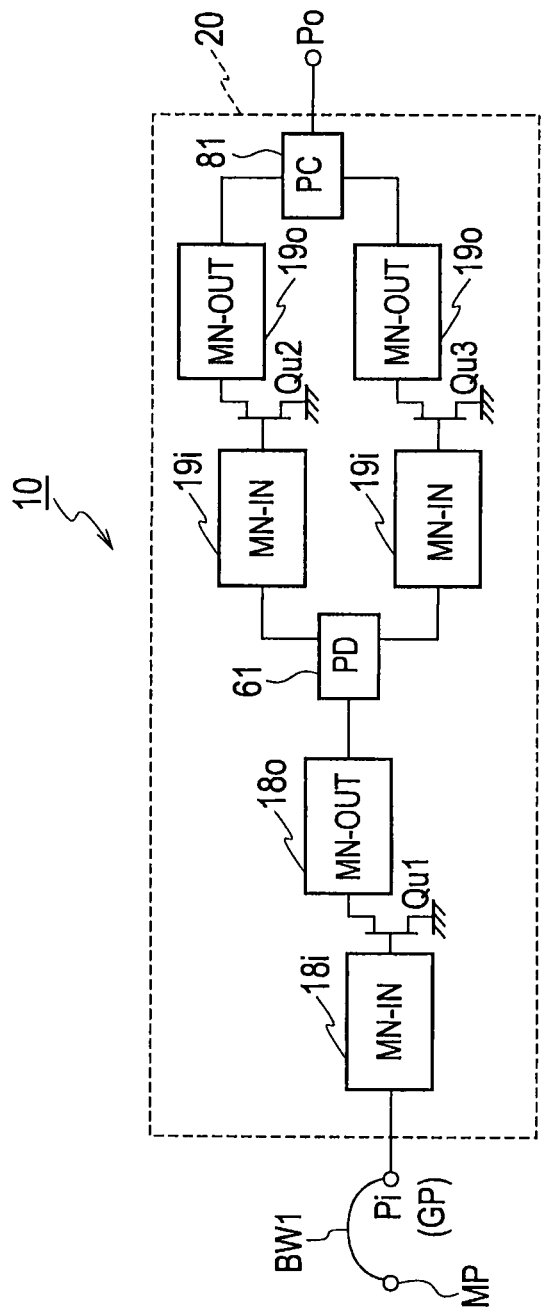
FIG. 14 is a schematic circuit block configuration diagram showing the power amplifier according to the embodiment.

In FIG. 1 and FIG. 2, although circuit configurations of the MMIC substrates 1 and 1a are illustrated merely as certain examples, and are therefore not limited to such the configurations. For example, a circuit configuration of power amplifier specified in detail in FIG. 14 is applicable to such the configurations. A signal electric power amplified by a transistor Qu1 is distributed by an electric power distributor 61 to be input into transistors Qu2 and Qu3. The signal electric power amplified by the transistors Qu2 and Qu3 is combined by an electric power combiner 81.

In addition, a configuration of each transistor Qu1 Qu2 and Qu3 will be specified in detail in FIG. 15 or FIG. 16 later on.

As shown in FIG. 1, the power amplifier 10 according to the embodiment includes: an MMIC substrate 1; a high frequency probe pad 24a (GP) disposed on the MMIC substrate 1; and a metal plate MP disposed on the MMIC substrate 1 so as to adjoin to the high frequency probe pad GP, and connected to an MMIC external circuit 2 via a bonding wire(s) BWM.

Also, as shown in FIG. 1, the power amplifier 10 according to the embodiment includes: a pair of ground terminal electrodes S0 and S0 disposed on a first surface of the MMIC substrate 1 so as to adjoin to the high frequency probe pad GP 1; VIA holes SC0 and SC0 disposed at a lower part of the respective ground terminal electrodes S0 and S0; and a back side surface ground electrode (130: refer to FIG. 7) disposed on a second surface opposite to the first surface of the MMIC substrate 1, and connected to the respective ground terminal electrodes S0 and S0 via the respective VIA holes SC0 and SC0. In this case, a signal terminal of high frequency probe can be connected to the high frequency probe pad GP from external, and a pair of ground terminals of high frequency probe can be connected to the pair of the ground terminal electrodes S0 and S0 of from external.

A difference between the power amplifier 10 according to the embodiment and the power amplifier 10a according to the comparative example is in a point that the metal plate MP is disposed in a configuration of an input connecting portion of the MMIC substrate 1 connected to the input side MMIC external circuit 2. By the way, a metal plate MP is not disposed in particular in a configuration of an output connecting portion of the MMIC substrate 1 connected to an output side MMIC external circuit 3. This is because an effect on the output electric power output from the power amplifier 10 of the MMIC substrate 1 can be suppressed by reducing a distance between an output side high frequency probe pad 24b (DP) and a signal line SL1 in the MMIC external circuit 3 in order to reduce a length of a bonding wire(s) BW2 for connecting between the output side high frequency probe pad 24b (DP) and the signal line SL1. In addition, each of the MMIC external circuits 2 and 3 includes a matching circuit, a package, an electric wiring of substrate, etc.

As shown in FIG. 1, since the metal plate MP is included in the power amplifier 10 according to the embodiment, the bonding wire BWM connects between a signal line SL0 of the input side MMIC external circuit 2 and the metal plate MP, and a bonding wire(s) BW1 connects between the metal plate MP and the high frequency probe pads GP in the inside of the MMIC substrate 1.

Figure 7:
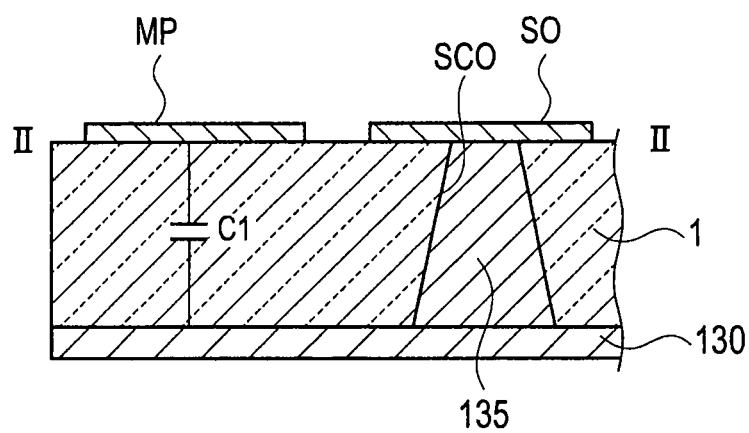
FIG. 7 is a schematic cross-sectional configuration diagram taken in the line II-II of FIG. 4A near the metal plate MP and the high frequency probe pad GP in the power amplifier according to the embodiment.

In this case, as shown in FIG. 1, a pattern structure for interstage probe is formed of the high frequency probe pad GP and the pair of the ground terminal electrodes S0 and S0 disposed on a position so as to sandwich the high frequency probe pad GP disposed on the input portion of the MMIC substrate 1. Similarly, a pattern structure for interstage probe is formed of the high frequency probe pad DP and the pair of the ground terminal electrodes S0 and S0 disposed on a position so as to sandwich the high frequency probe pad DP disposed on the output portion of the MMIC substrate 1. The ground terminal electrodes S0 and S0 are respectively connected to a ground electrode (130: FIG. 7) formed on a back side surface of the MMIC substrate 1 via VIA holes SC0 and SC0 formed so as to pass through the MMIC substrate 1. The pattern structure for interstage probe is a pattern which can be contacted by the high frequency probe at the time of interstage measurement. The high frequency probe pad GP disposed on the input portion of the MMIC substrate 1 is connected to an input pad GL of the power amplifier 10 via a signal line SL, and the high frequency probe pad DP disposed on the output unit of the MMIC substrate 1 is connected to an output pad DL of the power amplifier 10.

Figure 3A:
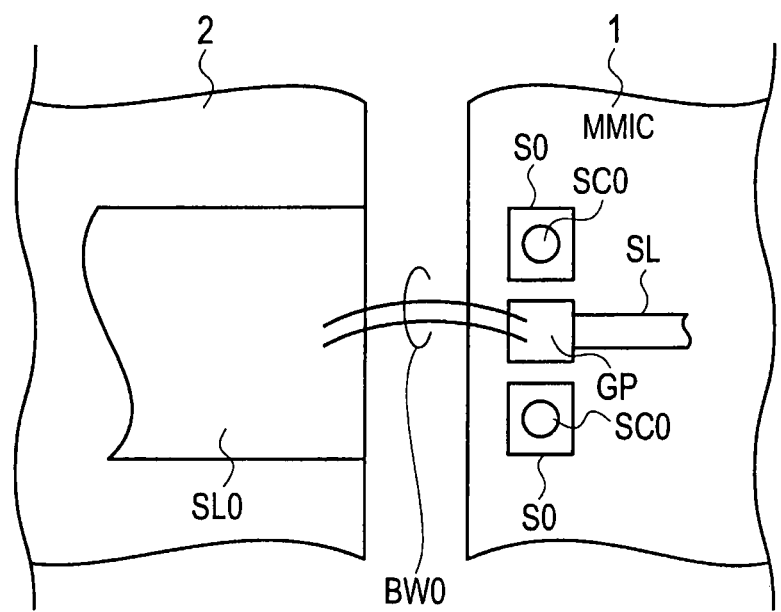
FIG. 3A is an enlarged schematic planar pattern configuration diagram showing a connecting portion between an MMIC and an MMIC external circuit in the power amplifier according to the comparative example.
Figure 3B:
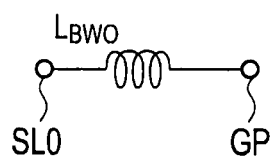
FIG. 3B is an explanatory diagram showing an equivalent inductance of bonding wire shown in FIG. 3A.

In the power amplifier 10a according to the comparative example, an enlarged schematic planar pattern configuration showing a connecting portion between the MMIC substrate 1a and the MMIC external circuit 2 is represented as shown in FIG. 3A, and an explanatory diagram of an equivalent circuit composed of a bonding wire BW0 is represented as shown in FIG. 3B.

Figure 4A:
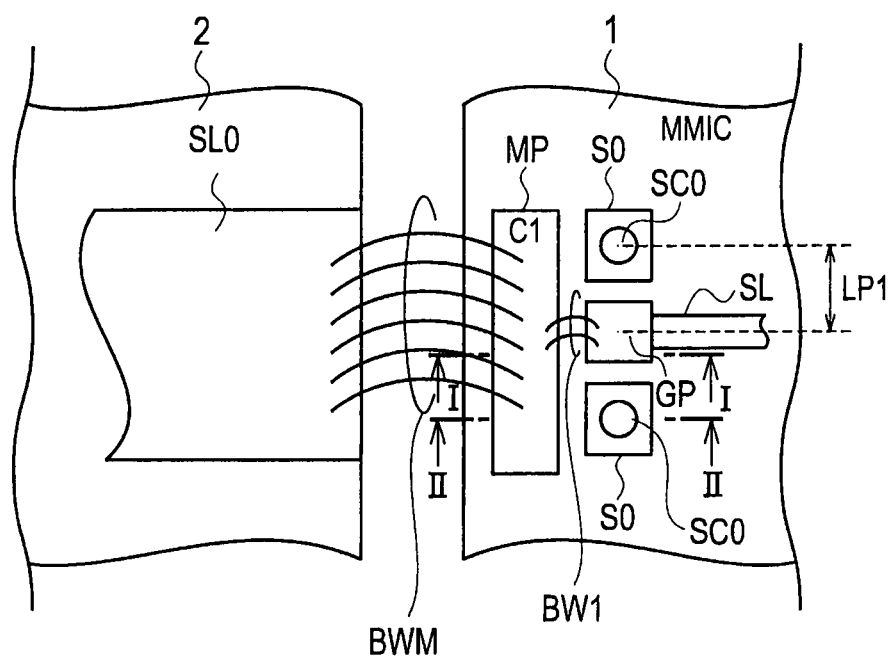
FIG. 4A is an enlarged schematic planar pattern configuration diagram showing a connecting portion between an MMIC and an MMIC external circuit in the power amplifier according to the embodiment.
Figure 4B:
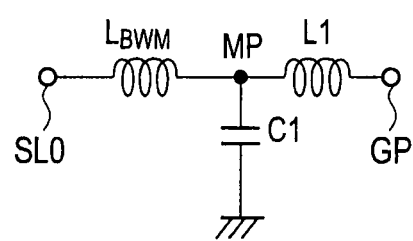
FIG. 4B is an explanatory diagram of the equivalent circuit composed of bonding wires BWM and BW1 and a metal plate MP shown in FIG. 4A.

On the other hand, in the power amplifier 10 according to the embodiment, an enlarged schematic planar pattern configuration showing the connecting portion between the MMIC substrate 1 and the MMIC external circuit 2 is represented as shown in FIG. 4A, and an explanatory diagram of an equivalent circuit composed of the bonding wires BWM and BW1 and the metal plate MP of FIG. 4A is represented as shown in FIG. 4B.

In the power amplifier 10a according to the comparative example, it is necessary to connect between the signal line SL0 of the MMIC external circuit 2 and the high frequency probe pads GP using the relatively long length of the bonding wire BW0. Furthermore, in the power amplifier 10a according to the comparative example, since the bonding width of the high frequency probe pad GP is narrow or the size of the bonding region thereof is limited, the number of the bonding wires BW0 is also limited relatively. Therefore, as shown in FIG. 3B, an equivalent inductance $L_{BW0}$ is formed between the signal line SL0 of the MMIC external circuit 2 and the high frequency probe pad GP.

On the other hand, in the power amplifier according to the embodiment, between the signal line SL0 of the MMIC external circuit 2 and the high frequency probe pads GP is connected via the metal plate MP. That is, it can connect between the signal line SL0 of the MMIC external circuit 2 and the metal plate MP using the relatively short length of the bonding wire BWM, as compared with the comparative example. Furthermore, in the power amplifier according to the embodiment, since the metal plate MP has the sufficient bonding width or the sufficient size of the bonding region, the number of the bonding wire BWM can also be increased relatively. Yet also, it can connect between the high frequency probe pads GP and the metal plate MP using the relatively short length of the bonding wire BW1, as compared with the comparative example. As a result, as shown in FIG. 4B, an equivalent circuit for correcting the effects of bonding wires is obtained between the signal line SL0 of the MMIC external circuit 2 and the high frequency probe pad GP. The equivalent circuit for correcting the effects of bonding wires is composed of: an equivalent capacitance C1 which the metal plate MP has between the ground potential and the metal plate MP; and an equivalent inductance L1 of the bonding wire BW1 connected between the metal plate MP and the high frequency probe pads GP, in addition to an equivalent inductance $L_{BWM}$ of the bonding wire BWM.

Figure 5:
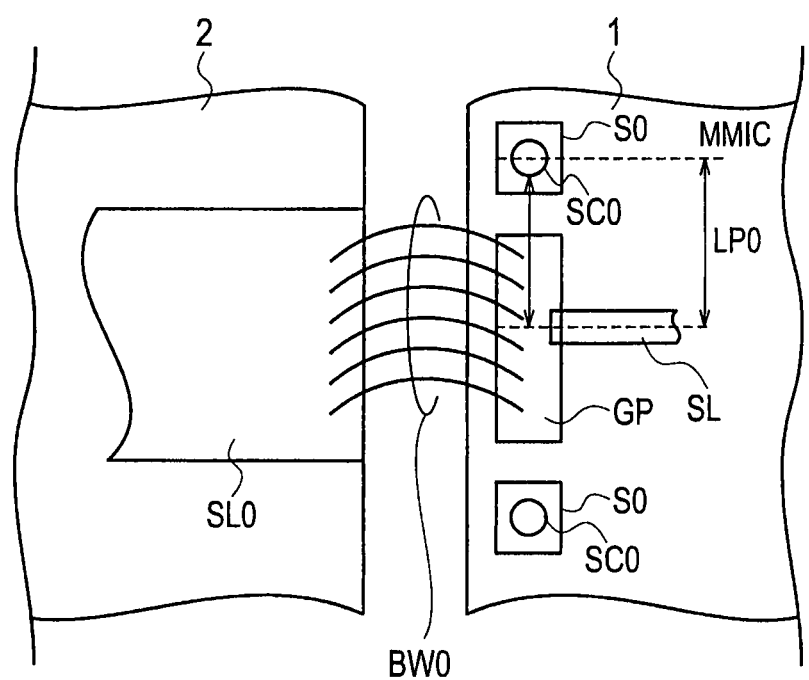
FIG. 5 is a schematic planar pattern configuration diagram for explaining a distance between a high frequency probe pad of the MMIC and the MMIC external circuit in the power amplifier according to the comparative example.

In the power amplifier 10a according to the comparative example, a schematic planar pattern configuration for explaining a distance between the high frequency probe pad GP of the MMIC substrate 1a and the MMIC external circuit 2 is represented as shown in FIG. 5. FIG. 5 shows an example of the width of the high frequency probe pad GP being set up widely in order to increase the number of the bonding wires BW0 to six (the same number as the example of the bonding wires BWM shown in FIG. 4A). In the comparative example shown in FIG. 5, since the ground terminal electrodes S0 and S0 are disposed so as to sandwich the high frequency probe pad GP, a pitch LP0 from a center of the signal line SL to the respective ground terminal electrodes S0 and S0 is about 350 μm, for example. On the other hand, in the embodiment shown in FIG. 4, a pitch LP1 from a center of the signal line SL to the respective ground terminal electrodes S0 and S0 is about 150 μm, for example, thereby reducing the occupied area.

Figure 6A:
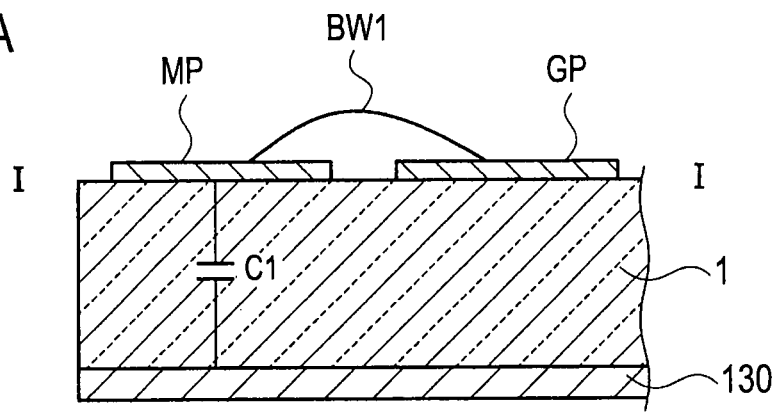
FIG. 6A is a schematic cross-sectional configuration diagram taken in the line I-I of FIG. 4A near the metal plate MP and a high frequency probe pad GP in the power amplifier according to the embodiment.
Figure 6B:
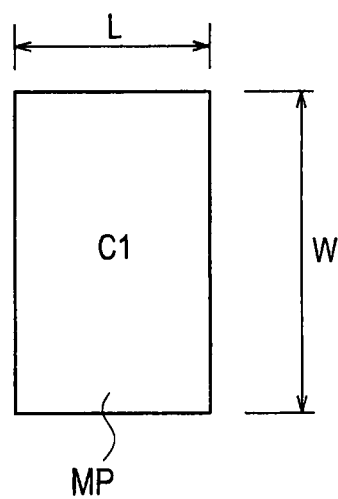
FIG. 6B is a schematic top configuration diagram showing the metal plate MP in the power amplifier according to the embodiment.

In the power amplifier according to the embodiment, a schematic cross-sectional structure taken in the line I-I of FIG. 4A near the metal plate MP and the high frequency probe pad GP is represented as shown in FIG. 6A, and a schematic top configuration of metal plate MP is represented as shown in FIG. 6B.

Also, in the power amplifier according to the embodiment, a schematic cross-sectional structure taken in the line of FIG. 4A near the metal plate MP and the high frequency probe pad GP is represented as shown in FIG. 7.

As shown in FIG. 6A and FIG. 6B, the metal plate MP has an area of width W and length L, and is disposed on the MMIC substrate 1, thereby forming the equivalent capacitance C1 between the metal plate MP and the ground electrode 130 of the back side surface. A low pass filter is composed by combining the equivalent capacitance C1 with the equivalent inductance $L_{BWM}$ of the bonding wire BWM and the equivalent inductance L1 of the bonding wire BW1.

That is, as shown in FIG. 4B, the low pass filter is composed of: the equivalent inductance LBWM of the first bonding wire BWM; the equivalent capacitance C1 which the metal plate MP has; and the equivalent inductance L1 of the second bonding wire BW1 connected between the metal plate MP and the high frequency probe pad GP. In this case, the MMIC substrate 1 is formed of GaAs, for example, and the thickness thereof is 50 μm, for example. The width W of the metal plate MP is about 200 μm, the length L thereof is about 150 μm, and the value of the equivalent capacitance C1 is about 0.09 pF as a result. On the other hand, as shown in FIG. 4A, the bonding wires BWM are composed of six wires, for example, and the value of the equivalent inductance $L_{BWM}$ of the bonding wires BWM is about 0.18 nH. Also, the value of the equivalent inductance L1 of the bonding wire BW1 is about 0.06 nH.

Also, as shown in FIG. 7, each of the VIA holes SC0 is disposed at a lower part of each of the ground terminal electrodes S0, and each of the ground terminal electrodes S0 is connected to the ground electrode 130 disposed on the second surface opposite to the first surface of the MMIC substrate 1 via an filling metal layer 135 formed in each of the VIA holes SC0.

Figure 8A:
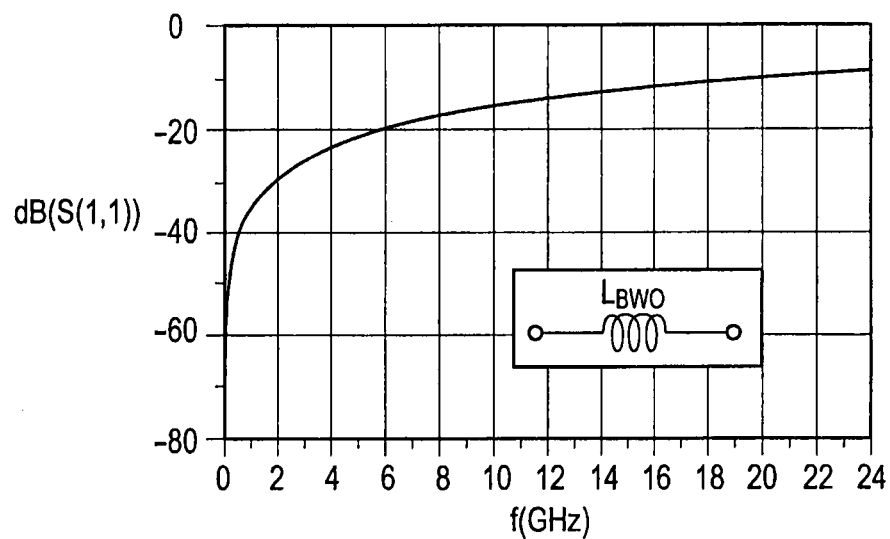
FIG. 8A shows an example of frequency characteristics of S parameter S (1, 1) of the bonding wire BW0 shown in FIG. 3A corresponding to the comparative example.
Figure 8B:
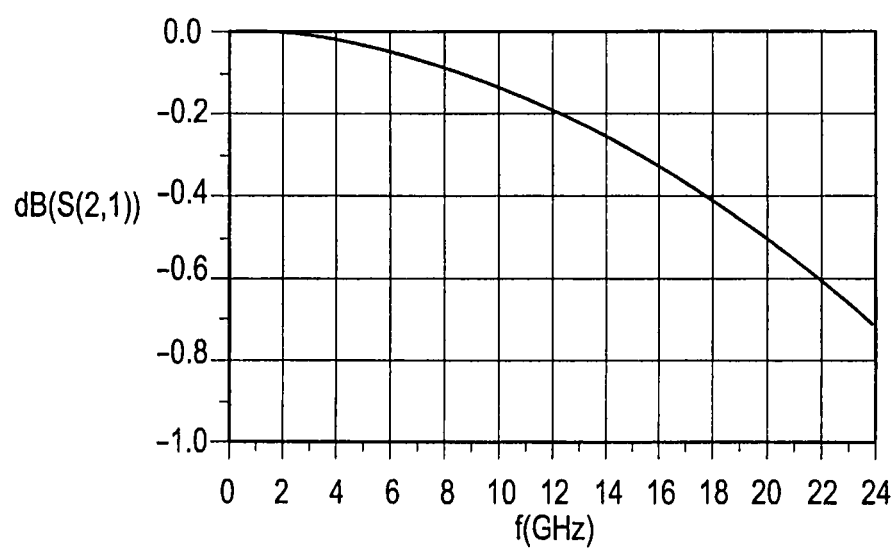
FIG. 8B shows an example of frequency characteristics of S parameter S (2, 1) of the bonding wire BW0 shown in FIG. 3A corresponding to the comparative example.

An example of frequency characteristics of S parameter S (1, 1) of the bonding wire BW0 in FIG. 3A corresponding to the comparative example is represented as shown in FIG. 8A, and an example of frequency characteristics of S parameter S (2, 1) of the bonding wire BW0 in FIG. 3A corresponding to the comparative example is represented as shown in FIG. 8B.

Figure 9A:
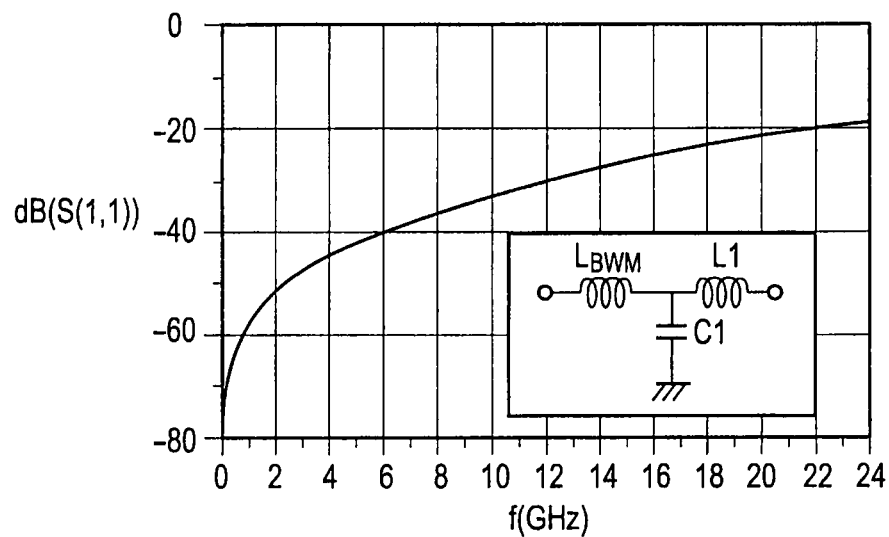
FIG. 9A shows an example of frequency characteristics of S parameter S (1, 1) of the equivalent circuit for correcting the effects of the bonding wires composed of the bonding wires BWM and BW1 and the metal plate MP shown in FIG. 4A corresponding to the embodiment.
Figure 9B:
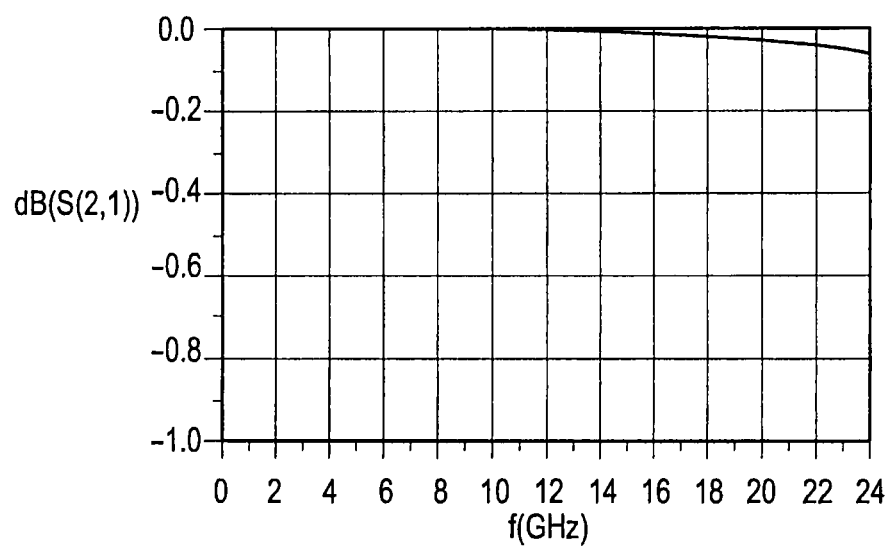
FIG. 9B shows an example of frequency characteristics of S parameter S (2, 1) of the equivalent circuit for correcting the effects of the bonding wires composed of the bonding wires BWM and BW1 and the metal plate MP shown in FIG. 4A corresponding to the embodiment.

On the other hand, an example of frequency characteristics of S parameter S (1, 1) of the equivalent circuit for correcting the effects of bonding wires composed of the bonding wires BWM and BW1 and the metal plate MP of FIG. 4A corresponding to the embodiment is represented as shown in FIG. 9A, and an example of frequency characteristics of S parameter S (2, 1) of the equivalent circuit for correcting the effects of bonding wires in FIG. 4A corresponding to the embodiment is represented as shown in FIG. 9B.

As clearly from FIG. 8 and FIG. 9, according to the equivalent circuit for correcting the effects of bonding wires, until the frequency is up to 20 GHz, since a corrected return loss not more than 20 dB can be obtained by the characteristics of S parameter S (1, 1), a corrected return loss not less than −0.1 db can be obtained by the characteristics of S parameter S (2, 1), and the value of the S parameter S (2, 1) is close to 0 dB, it proves that the effect of the bonding wire BWM can be suppressed.

Figure 10:
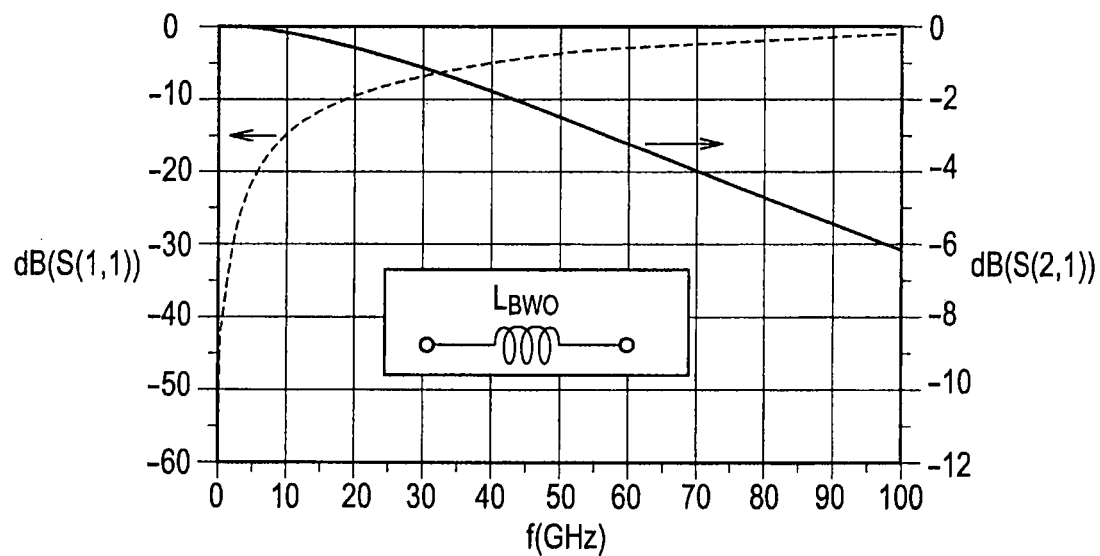
FIG. 10 shows an example of frequency characteristics of S parameter S (1, 1) and S parameter S (2, 1) of the bonding wire BW0 shown in FIG. 3A corresponding to the comparative example.

An example of frequency characteristics over a range of the frequencies f=0 to 100 GHz of S parameter S (1, 1) and S parameter S (2, 1) of the bonding wire BW0 in FIG. 3A corresponding to a comparative example is represented as shown in FIG. 10.

Figure 11:
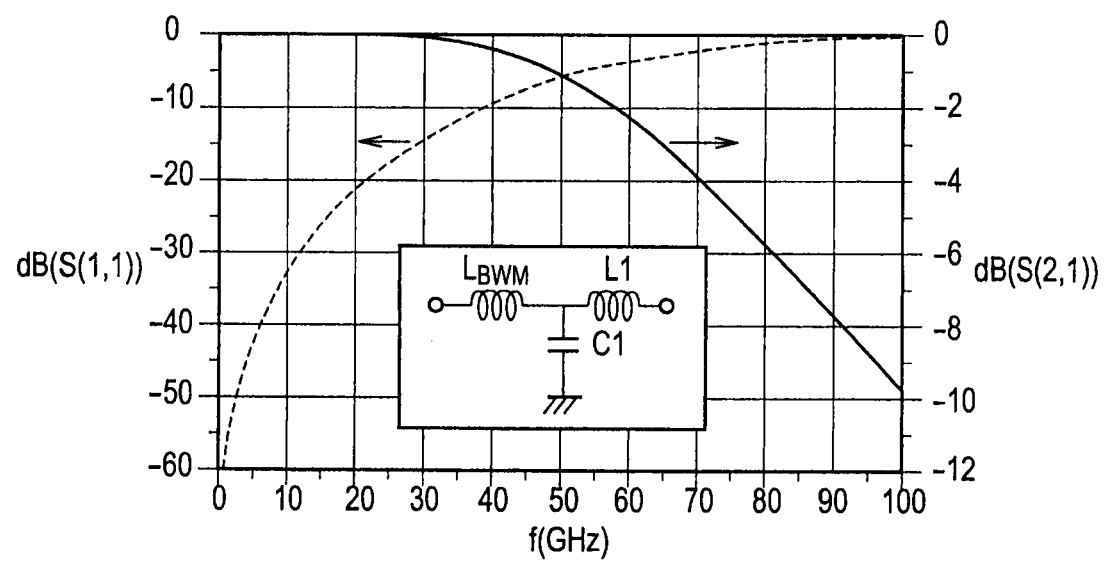
FIG. 11 shows an example of frequency characteristics of S parameter S (1, 1) and S parameter S (2, 1) of the equivalent circuit composed of the bonding wires BWM and BW1 and the metal plate MP shown in FIG. 4A corresponding to the embodiment.

On the other hand, an example of frequency characteristics over a range of the frequencies f=0 to 100 GHz of S parameter S (1 1) and S parameter S (2, 1) of the equivalent circuit for correcting the effects of bonding wires composed of the bonding wires BWM and BW1 and the metal plate MP of FIG. 4A corresponding to the embodiment is represented as shown in FIG. 11.

As clearly from FIG. 10 and FIG. 11, according to the equivalent circuit for correcting the effects of bonding wires, since a corrected return loss not more than 20 dB can be obtained by the characteristics of S parameter S (1, 1) until the frequency is up to 20 GHz, and a corrected return loss not less than −2.0 dB can be obtained from the characteristics of S parameter S (2, 1) until the frequency is up to 55 GHz, it proves that the effect of the bonding wire BW0 can be suppressed over the higher frequency range compared with the comparative example.

Figure 12:
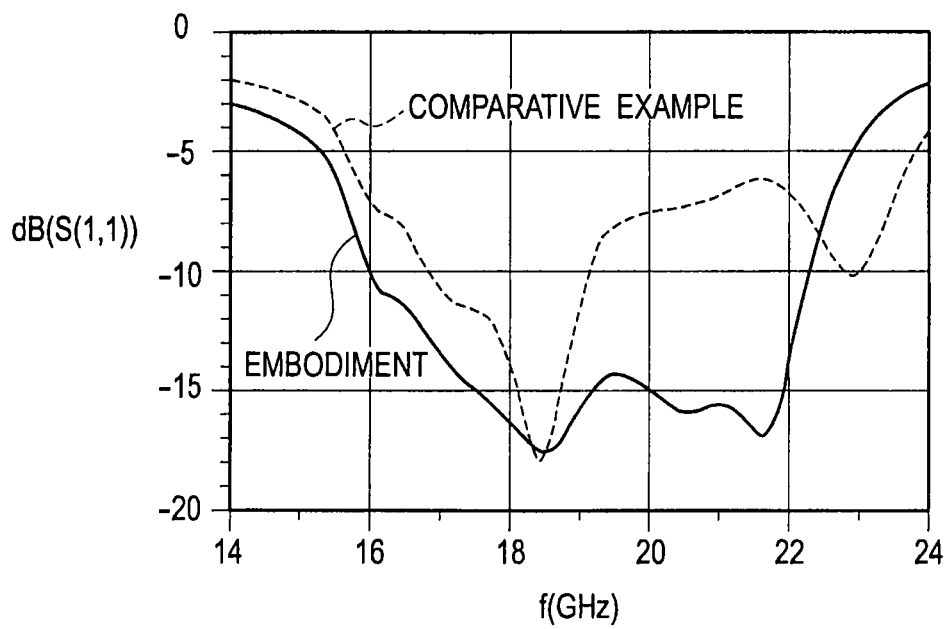
FIG. 12 shows an example of frequency characteristics of S parameter S (1, 1) of the MMIC of the power amplifier according to the embodiment.

An example of frequency characteristics of S parameter S (1, 1) of the MMIC of the power amplifier according to the embodiment is represented as shown in FIG. 12. An example of frequency characteristics of S parameter S (1, 1) of the MMIC of the power amplifier according to the comparative example is also shown in FIG. 12. As clearly from FIG. 12, the value of S parameter S (1, 1) of the MMIC of the power amplifier according to the comparative example is about −8.7 dB, in the frequency at 20 GHz. On the other hand, the value of S parameter S (1, 1) of the MMIC of the power amplifier according to the embodiment is about −15 dB in the frequency at 20 GHz, and thereby the value of S parameter S (1, 1) is improved by as much as about +6.3 dB.

Figure 13:
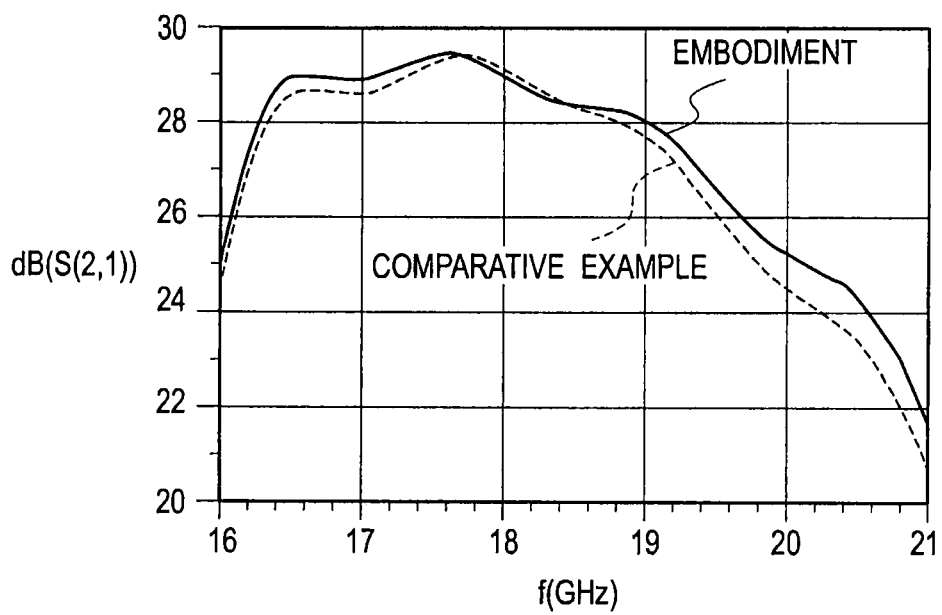
FIG. 13 shows an example of frequency characteristics of S parameter S (2, 1) of the MMIC of the power amplifier according to the embodiment.

An example of the frequency characteristics of S parameter S (2, 1) of the MMIC of the power amplifier according to the embodiment is represented as shown in FIG. 13. Similarly, an example of the frequency characteristics of S parameter S (2, 1) of the MMIC of the power amplifier according to the comparative example is also shown in FIG. 13. As clearly from FIG. 13, the value of S parameter S (2, 1) of the MMIC of the power amplifier according to the comparative example is about −24.5 dB, in the frequency at 20 GHz. On the other hand, the value of S parameter S (2, 1) of the MMIC of the power amplifier according to the embodiment is about −25.5 dB in the frequency at 20 GHz, and thereby the value of S parameter S (2, 1) is improved by as much as about +1 dB.

The effect of the equivalent inductance $L_{BWM}$ of the bonding wire BWM connected to the external of the MMIC substrate 1 can be reduced by adjusting the size of area of the metal plate MP, i.e., the value of the equivalent capacitance C1. Accordingly, in the power amplifier according to the embodiment, the effect of the bonding wire BWM connected to the external of the MMIC substrate 1 can be substantially suppressed due to installing the metal plate MP on the MMIC substrate 1.

According to the power amplifier according to the embodiment, the effect of the bonding wire can be suppressed and space-saving can be achieved with the comparatively easy configuration.

(Example of Schematic Circuit Block Configuration of Power Amplifier)

As shown in FIG. 14, a schematic circuit block configuration of the power amplifier according to the embodiment includes: the metal plate MP connected to the high frequency probe pad GP via the bonding wire(s) BW1; and an amplifying unit 20 connected to the high frequency probe pad GP.

The amplifying unit 20 includes: transistors Qu1, Qu2, and Qu3; a first input matching circuit 18i connected to an input side of the transistor Qu1 and a first output matching circuit 18o connected to an output side of the transistor Qu1; an electric power distributor (PD) 61 connected to the first output matching circuit 18o; a second input matching circuit 19i connected to the electric power distributor (PD) 61 and connected to an input side of the transistor Qu2 and a second output matching circuit 19o connected to an output side of the transistor Qu2; a second input matching circuit 19i connected to the electric power distributor (PD) 61 and connected to an input side of the transistor Qu3 and a second output matching circuit 19o connected to an output side of the transistor Qu3; and an electric power combiner (PC) 81 for combining the output from the two second output matching circuits 19o. In this case, the high frequency probe pad GP constitutes the input terminal Pi. Also, the electric power combiner (PC) 81 is connected to the output terminal Po.

According to the power amplifier 10 according to the embodiment, the frequencies are distributed to a low frequency region and a high frequency region, for example, and the high-frequency power amplifier and the low-frequency power amplifier are connected in parallel via the electric power distributor and the electric power combiner, and thereby broader bandwidths can be achieved and satisfactory flatness of output characteristic can also be achieved, without being affected by the length of the bonding wire at the time of connecting the bonding wire to the external circuit, due to installing the metal plate MP.

(Semiconductor Device)

Figure 15:
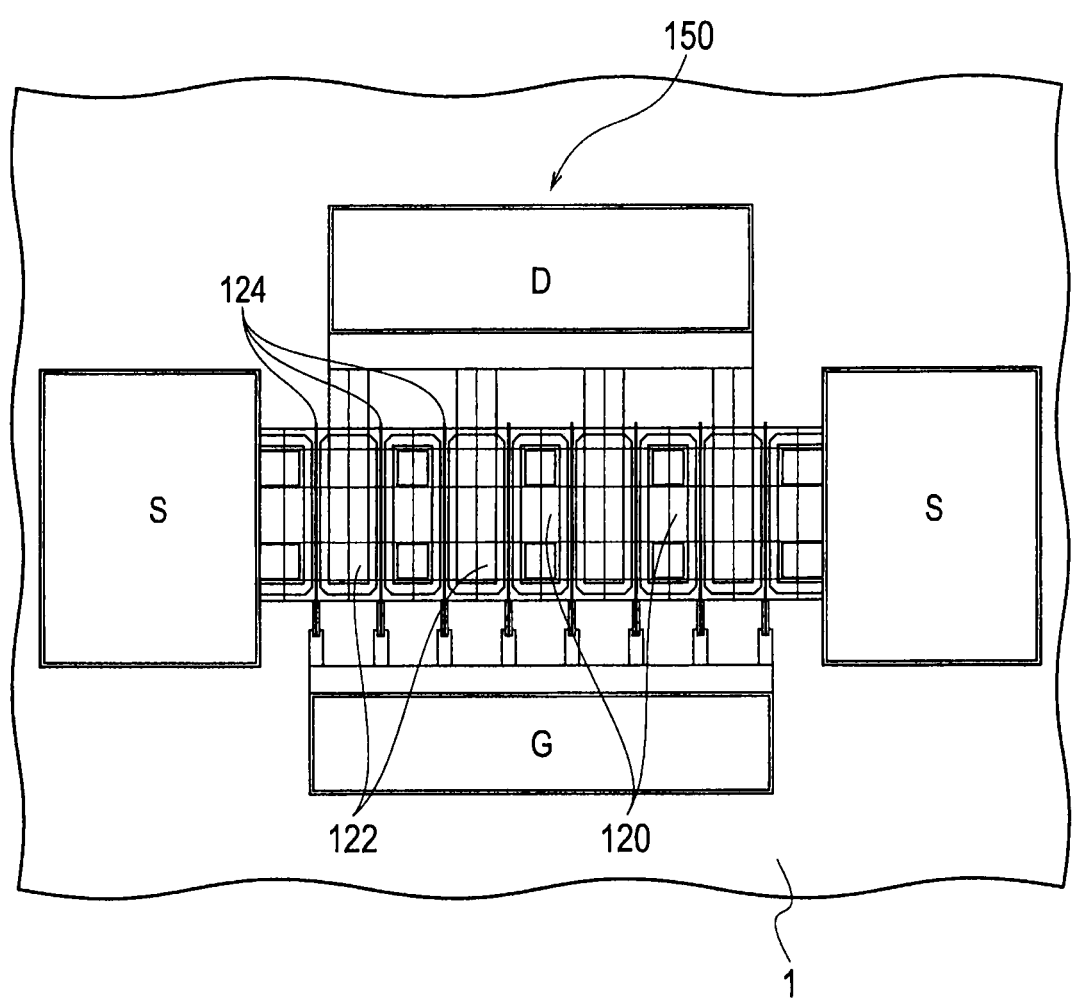
FIG. 15 is a schematic planar pattern configuration diagram showing a constitution of FET applicable to the power amplifier according to the embodiment.

As shown in FIG. 15, a schematic planar pattern configuration of FET 150 applicable to the power amplifier 10 according to the embodiment includes: a gate finger electrode 124, a source finger electrode 120, and a drain finger electrode 122 disposed on the MMIC substrate 1, and having a plurality of fingers, respectively; a gate terminal electrode G and a drain terminal electrode D disposed on the MMIC substrate 1, and tying the plurality of fingers, respectively, every gate finger electrode 124 and drain finger electrode 122; and a source terminal electrode S disposed on the MMIC substrate 1 and connected to a plurality of fingers of the source finger electrode 120 with overlay electric contact, respectively. Here, a VIA hole is disposed at a lower part of the source terminal electrode S, although the illustration is omitted. The schematic planar pattern configuration of each transistor Qu1, Qu2 and Qu3 shown in FIG. 1 or FIG. 2 corresponds to FIG. 15.

Figure 16:
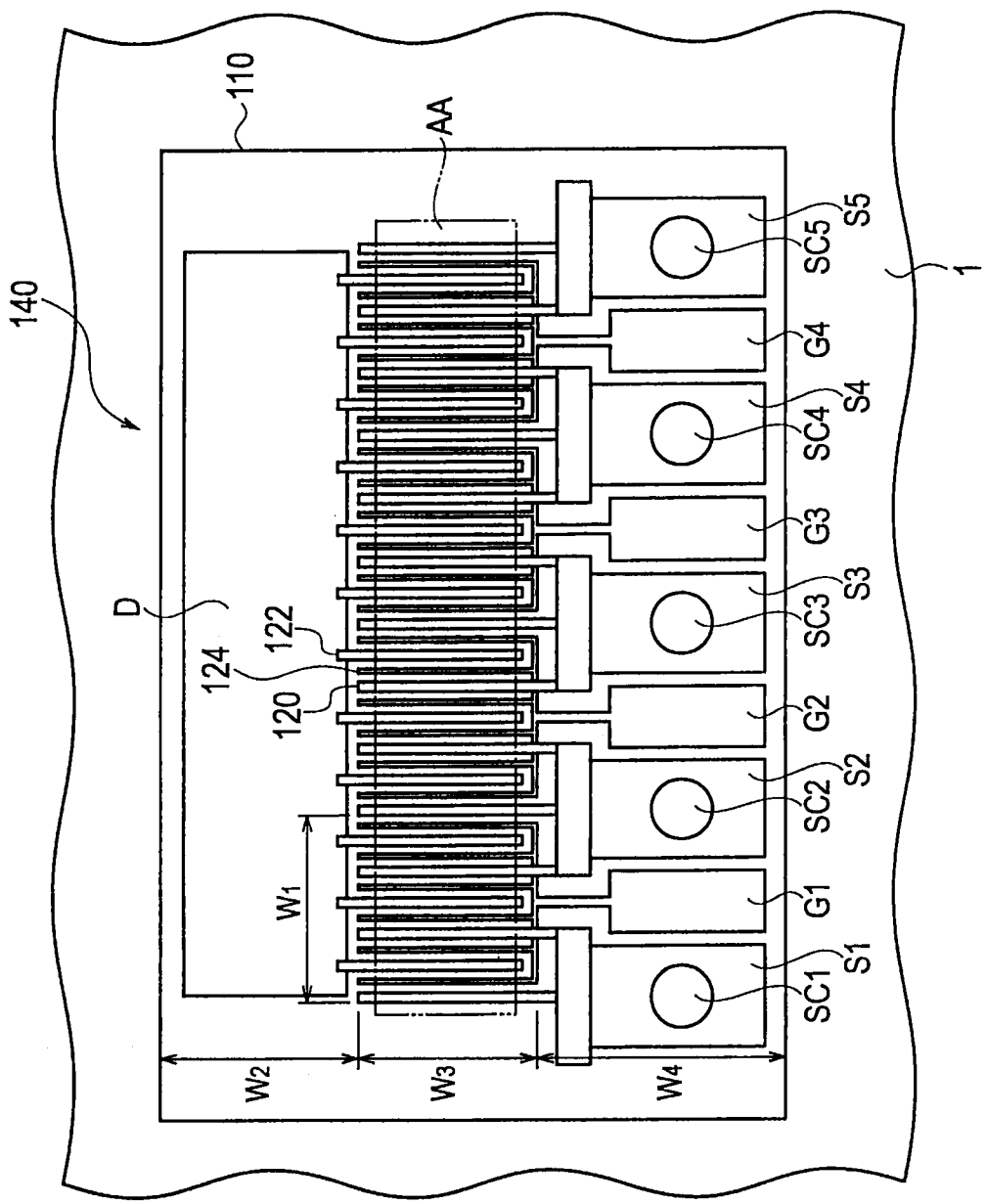
FIG. 16 is a schematic planar pattern configuration diagram showing an alternative constitution of FET applicable to the power amplifier according to the embodiment.

As shown in FIG. 16, a schematic planar pattern configuration of an alternative FET 140 applicable to the power amplifier 10 according to the embodiment includes: a substrate 110 on the MMIC substrate 1; a gate finger electrode 124, a source finger electrode 120, and a drain finger electrode 122 disposed on a first surface of the substrate 110, and having a plurality of fingers, respectively; a plurality of gate terminal electrodes G1, G2, . . . , G4, a plurality of source terminal electrodes S1, S2 . . . , S5, and a drain terminal electrode D disposed on the first surface of the substrate 110, and tying the plurality of fingers, respectively every gate finger electrode 124, source finger electrode 120 and drain finger electrode 122; VIA holes SC1, SC2, . . . , SC5 disposed at a lower part of the respective source terminal electrodes S1, S2, . . . , S5; and a ground electrode (130: refer to FIG. 7) disposed on a second surface opposite to the first surface of the substrate 110, and connected to the respective source terminal electrodes S1, S2, . . . , S5 via filling metal layers (135: refer to FIG. 7) formed in the respective VIA holes SC1, SC2, . . . , SC5. In the example of FIG. 16, the gate terminal electrodes G1, G2, . . . , G4 and the source terminal electrodes S1, S2, . . . , S5 are disposed on a terminal of one side, and the drain terminal electrode D is disposed on a terminal of another side. An active area AA is formed on the substrate 10 of a lower part of the gate finger electrode 124, the source finger electrode 120 and the drain finger electrode 122, near the surface of the substrate 10.

In the example of FIG. 16, as for the size of each part, for example, the cell width W1 is about 120 µm, W2 is about 80 µm, the cell length W3 is about 200 µm, W4 is about 120 µm, and the gate width WG is about 200 µm×6×4 cells=4.8 mm as a whole. The cell length W3 in longitudinal direction of the gate finger electrode 124, the source finger electrode 120, and the drain finger electrode 122 is set up to be shorter as the operating frequency becomes higher such as microwave/millimeter wave/submillimeter wave. For example, in the millimeter wave band, the cell length W3 is about 25 µm to 50 µm.

Also, the width of the source finger electrode 120 is about 40 µm, for example, and the width of the source terminal electrodes S1, S2, . . . , S5 is about 100 µm, for example. The formation width of the VIA holes SC1, SC2, . . . , SC5 is about 10 µm to about 40 µm, for example.

The substrate 110 may be provided with any one of an SiC substrate, a GaAs substrate, a GaN substrate, a substrates in which a GaN epitaxial layer is formed on the SiC substrate, a substrate in which the GaN epitaxial layer is formed on an Si substrate, a substrate in which a heterojunction epitaxial layer composed of GaN/AlGaN is formed on the SiC substrate, a substrate in which the GaN epitaxial layer is formed on a sapphire substrate, a sapphire substrate or a diamond substrate, and a semi-insulating substrate.

According to the power amplifier according to the embodiment, the characteristics can be secured, without being affected by the length of the bonding wire at the time of connecting the bonding wire to the external circuit, due to installing the metal plate MP in the MMIC having the high frequency probe pad.

According to the power amplifier according to the embodiment, the inductance of the bonding wire can be canceled by the equivalent capacitance C1 of the metal plate MP.

According to the power amplifier according to the embodiment, the distance between the MMIC pad (high frequency probe pad) and the signal line of the MMIC external circuit can be shortened due to installing the metal plate MP, and thereby the effect of the inductance component of the bonding wire can be suppressed and space-saving can also be achieved.

According to the embodiment described above, it can provide the power amplifier which can suppress the effect of the bonding wire and can achieve space-saving with the comparatively easy configuration.

OTHER EMBODIMENTS

While some embodiments have been described, the embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, not only FET or HEMT but also amplifying elements, such as a Laterally Diffused Metal-Oxide-Semiconductor Field Effect Transistor (LDMOS) or a Heterojunction Bipolar Transistor (HBT), a Micro Electro Mechanical Systems (MEMS) element, etc. are applicable as a discrete transistor applied to the wide band power amplifier according to the embodiment.

What is claimed is:

1. A power amplifier comprising:
an MMIC substrate;
a high frequency probe pad disposed on the MMIC substrate;
a metal plate disposed on the MMIC substrate so as to adjoin to the high frequency probe pad, and connected to an MMIC external circuit via a first bonding wire;
a pair of ground terminal electrodes disposed on a first surface of the MMIC substrate to adjoin to the high frequency probe pad;
VIA holes disposed at a lower part of the respective ground terminal electrodes; and
a back side surface ground electrode disposed on a second surface opposite to the first surface of the MMIC substrate, and connected to the respective ground terminal electrodes via the respective VIA holes, wherein
a signal terminal of high frequency probe can be connected to the high frequency probe pad GP, and a pair of ground terminals of high frequency probe can be connected to the pair of the ground terminal electrodes.

2. The power amplifier according to claim 1, wherein a low pass filter is formed of an inductance of the first bonding wire, a capacitor formed between the metal plate and the back side surface ground electrode, and an inductance of a second bonding wire connected between the metal plate and the high frequency probe pad.

3. The power amplifier according to claim 1, wherein a transistor is installed in the power amplifier, the transistor comprising:
a substrate;
a gate finger electrode, a source finger electrode, and a drain finger electrode disposed on a first surface of the substrate and having a plurality of fingers, respectively;
a plurality of gate terminal electrodes, a plurality of source terminal electrodes, and a drain terminal electrode disposed on the first surface of the substrate and tying a plurality of fingers, respectively for every the gate finger electrode, the source finger electrode, and the drain finger electrode;
VIA holes disposed at an under part of the respective source terminal electrodes; and
a ground electrode disposed on a second surface opposite to the first surface of the substrate, and connected to the respective source terminal electrodes via the respective VIA holes.

4. The power amplifier according to claim 2, wherein a transistor is installed in the power amplifier, the transistor comprising:
a substrate;
a gate finger electrode, a source finger electrode, and a drain finger electrode disposed on a first surface of the substrate and having a plurality of fingers, respectively;
a plurality of gate terminal electrodes, a plurality of source terminal electrodes, and a drain terminal electrode disposed on the first surface of the substrate and tying a plurality of fingers, respectively for every the gate finger electrode, the source finger electrode, and the drain finger electrode;
VIA holes disposed at an under part of the respective source terminal electrodes; and
a ground electrode disposed on a second surface opposite to the first surface of the substrate, and connected to the respective source terminal electrodes via the respective VIA holes.

5. The power amplifier according to claim 1, wherein a transistor is installed in the power amplifier, the transistor comprising:
a substrate;
a gate finger electrode, a source finger electrode, and a drain finger electrode disposed on the substrate and having a plurality of fingers, respectively;
a gate terminal electrode and a drain terminal electrode disposed on the substrate and tying a plurality of fingers, respectively for every gate finger electrode and drain finger electrode; and
a source terminal electrode disposed on the substrate, and connected to a plurality of fingers of the source finger electrode with overlay electric contact, respectively.

6. The power amplifier according to claim 2, wherein a transistor is installed in the power amplifier, the transistor comprising:
a substrate;
a gate finger electrode, a source finger electrode, and a drain finger electrode disposed on the substrate and having a plurality of fingers, respectively;
a gate terminal electrode and a drain terminal electrode disposed on the substrate and tying a plurality of fingers, respectively for every gate finger electrode and drain finger electrode; and
a source terminal electrode disposed on the substrate, and connected to a plurality of fingers of the source finger electrode with overlay electric contact, respectively.

7. The power amplifier according to claim 3, wherein
the substrate is a substrate selected from the group consisting of an SiC substrate, a GaAs substrate, a GaN substrate, a substrates in which a GaN epitaxial layer is formed on the SiC substrate, a substrate in which the GaN epitaxial layer is formed on an Si substrate, a substrate in which a heterojunction epitaxial layer composed of GaN/AlGaN is formed on the SiC substrate, a substrate in which the GaN epitaxial layer is formed on a sapphire substrate, a sapphire substrate or a diamond substrate, and a semi-insulating substrate.

8. The power amplifier according to claim 5, wherein
the substrate is a substrate selected from the group consisting of an SiC substrate, a GaAs substrate, a GaN substrate, a substrates in which a GaN epitaxial layer is formed on the SiC substrate, a substrate in which the GaN epitaxial layer is formed on an Si substrate, a substrate in which a heterojunction epitaxial layer composed of GaN/AlGaN is formed on the SiC substrate, a substrate in which the GaN epitaxial layer is formed on a sapphire substrate, a sapphire substrate or a diamond substrate, and a semi-insulating substrate.

* * * * *